(12) United States Patent
Berthiot

(10) Patent No.: US 6,304,126 B1
(45) Date of Patent: Oct. 16, 2001

(54) PROTECTION CIRCUIT THAT CAN BE ASSOCIATED WITH A FILTER

(75) Inventor: Denis Berthiot, Tours (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/388,572

(22) Filed: Sep. 1, 1999

Related U.S. Application Data

(63) Continuation-in-part of application No. 09/162,399, filed on Sep. 28, 1998, now Pat. No. 6,147,853.

(30) Foreign Application Priority Data

Sep. 29, 1997 (FR) .................................................. 97 12297

(51) Int. Cl.[7] .............................. H03K 5/08; H03L 5/00
(52) U.S. Cl. ......................... 327/320; 327/321; 327/326; 361/111; 361/56
(58) Field of Search ...................................... 327/314, 320, 327/321, 325, 326; 361/91, 56, 91.5, 111, 118

(56) References Cited

U.S. PATENT DOCUMENTS

| | | | |
|---|---|---|---|
| 4,369,414 | * 1/1983 | Aoki et al. | 327/314 |
| 4,758,873 | 7/1988 | Monticelli | 257/296 |
| 4,984,031 | * 1/1991 | Rinderle | 361/91.5 |
| 5,245,499 | 9/1993 | Senes | 361/56 |
| 5,287,241 | * 2/1994 | Pura | 361/56 |
| 5,357,393 | * 10/1994 | Mojaradi et al. | 361/56 |
| 5,392,188 | 2/1995 | Epstein | 361/118 |
| 5,561,313 | 10/1996 | Saito et al. | 257/360 |
| 6,025,746 | * 2/2000 | So | 327/314 |
| 6,147,853 | * 11/2000 | Berthiot | 361/111 |

FOREIGN PATENT DOCUMENTS

| | | |
|---|---|---|
| 37 20 046 | 12/1987 | (DE) . |
| A-0 569 221 | 11/1993 | (EP) . |
| 0 905 852 | 3/1999 | (EP) . |
| A-2 172 453 | 9/1986 | (GB) . |

OTHER PUBLICATIONS

Patent Abstracts of Japan, vol. 7, No. 36 (E–158), & JP 57 190359, Nov. 22, 1982.
Patent Abstracts of Japan, vol. 9, No. 225 (E–342) & JP 60 081868, May 9, 1985.

* cited by examiner

*Primary Examiner*—Timothy P. Callahan
*Assistant Examiner*—Long Nguyen
(74) *Attorney, Agent, or Firm*—Wolf, Greenfield & Sacks, P.C.; James H. Morris; Theodore E. Galanthay

(57) ABSTRACT

A structure for protection against electrostatic surges having two input terminals and two output terminals. The output terminals of the structure are connected to the inputs of a circuit to be protected. A first input terminal is connected to a first output terminal via an impedance. The second input terminal is connected to the second output terminal. The input terminals are interconnected by a first avalanche diode. The output terminals are interconnected by a second avalanche diode having the same biasing as the first avalanche diode.

4 Claims, 3 Drawing Sheets

US 6,304,126 B1

PROTECTION CIRCUIT THAT CAN BE ASSOCIATED WITH A FILTER

This application is a Continuation-in-Part of application Ser. No. 09/162,399, filed Sep. 28,1998 U.S. Pat. No. 6,147,853, entitled PROTECTION CIRCUIT THAT CAN BE ASSOCIATED WITH A FILTER and now pending, which application claims the benefit of priority under 35 USC §119(a) to French Application No. 97 12297, filed Sep. 29, 1997.

BACKGROUND OF THE INVENTION

1. Field of the Invention

The present invention relates to the field of protection circuits that protect against electric surges that may affect components and/or electronic devices such as, for example, mobile phones, computers, printers. It is particularly desired to protect such devices against electrostatic surges which can, for example, correspond to current peaks, that have short durations but very high intensities, for example, several tens of amperes.

2. Discussion of the Related Art

Conventionally, as is shown in FIG. 1A, to protect inputs 1 and 2 of a device 3 connected to external components, an avalanche diode 5 or an equivalent device is disposed between these inputs. Resistors 7 and 8 correspond to connection resistances or to resistors voluntarily inserted in the circuit.

Theoretically, as is shown in FIG. 1B, an avalanche diode requires a voltage $V_Z$ between its terminals to be conductive. However, when the current through this diode significantly increases, as is shown in FIG. 1B, voltage V across the avalanche diode increases to reach a value $V_S$ equal to $V_Z = R_Z I$, where I is the current associated with the surge. To take a practical example, considering an avalanche diode of a surface area of approximately 0.4 mm², in conventional technologies, the equivalent dynamic resistance $R_Z$ will be on the order of 0.4 ohm. If the current peak is on the order of 30 amperes, the effective voltage across an avalanche diode having a breakdown voltage of 6 volts will be 6+0.4× 30=18 volts. The effective value is triple the nominal voltage and a destruction of the components of the circuit to be protected can result therefrom.

It is known that to reduce the dynamic resistance of an avalanche diode, its surface should be increased. If the surface is increased by a factor 4, to reach for example a surface of 1.6 mm², the equivalent resistance will be of 0.1 ohms only. The overvoltage linked to the current flow will be of 3 volts only, that is, the voltage across the avalanche diode will reach, for 30 amperes, a value on the order of 9 volts, which remains acceptable.

However, this has the disadvantage that the cost of a diode increases with its surface and that a significant surface has to be provided so that the increase of the voltage with the current becomes negligible.

Further, an avalanche diode inevitably exhibits in the blocked (non-conducting) state a certain stray capacitance. In a conventional case, for a diode of 0.4 mm², there will be a stray capacitance on the order of 250 pF. If the diode surface is multiplied by 4, the straye capacitance will be multiplied by four to reach a value on the order of one nanofarad. As a result, the protection system exhibits a high capacitance which cannot be chosen independently from the choice of the resistance. This can be a disadvantage in some applications.

SUMMARY OF THE INVENTION

Thus, an object of the present invention is to overcome the disadvantages of prior art systems such as described hereabove.

Another object of the present invention is to provide a protection structure such that the voltage thereacross remains close to the expected nominal value.

Another object of the present invention is to provide such a structure which occupies a reduced silicon surface.

Another object of the present invention is to provide such a structure which exhibits a selected filtering characteristic.

To achieve these and other objects, the present invention provides a structure for protection against electric surges, connected between two input terminals and two output terminals, the output terminals being connected to the inputs of a circuit to be protected, a first input terminal being connected to a first output terminal via an impedance, the second input terminal being connected to the second output terminal, the input terminals being interconnected by a first avalanche diode, the output terminals being interconnected by a second avalanche diode of same polarity as the first avalanche diode.

According to an embodiment of the present invention, the two avalanche diodes are identical or at least substantially identical.

According to an embodiment of the present invention, the two avalanche diodes are bidirectional.

According to an embodiment of the present invention, the impedance is a resistor connected between the first input and output terminals.

According to an embodiment of the present invention, the impedance is a tripole impedance, a third terminal of which is connected to the second input and output terminals, the elements of the tripole forming, with the avalanche diodes, a filtering structure.

According to an embodiment of the present invention, the tripole includes two series resistors and a parallel capacitor.

The present invention also provides monolithic implementations of the above structure. In one embodiment a monolithic implementation of the implementation of the protection structure includes, in a substrate of a first type of conductivity, two areas of a second type of conductivity forming Zener junctions with the substrate, and one metallization formed on an upper surface of the substrate with interposition of an insulating layer.

In another embodiment, a monolithic implementation of the protection structure is formed from a substrate of a first conductivity type, the substrate having a front surface and a rear surface. The structure includes a region of a second and opposite conductivity type formed on the front surface of the substrate. The region of the second and opposite conductivity type has three main areas, each of the three main areas being covered with a respective first metallization. Two of the first metallizations are respectively connected to one of the first input terminal and the first output terminal, and the structure further includes a second metallization covering the rear surface of the substrate.

According to an advantage of the present invention which will be discussed in further detail hereafter, the structure of the present invention is particularly well adapted to being combined with structures ensuring determined filtering effects.

The foregoing objects, features and advantages of the present invention, will be discussed in detail in the following non-limiting description of specific embodiments in connection with the accompanying drawings.

DETAILED DESCRIPTION

Figure 2:
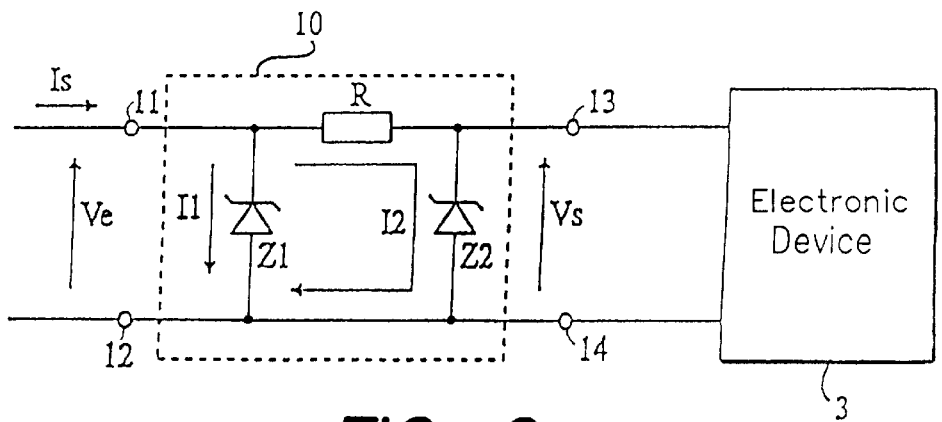
FIG. 2 shows an example of embodiment of a protection structure according to the present invention.

As is shown in FIG. 2, a protection structure 10 according to the present invention includes input terminals 11 and 12 and output terminals 13 and 14 connected to the circuit 3 to be protected. Terminals 12 and 14 are interconnected. Terminals 11 and 13 are connected via a resistor R. Terminals 11 and 12 are connected via an avalanche diode Z1. Terminals 13 and 14 are connected via an avalanche diode Z2.

Assuming that avalanche diodes Z1 and Z2 are identical and have the same avalanche voltage $V_Z$ and the same dynamic resistance $R_Z$, the input current $I_s$ resulting from a surge is:

$$I_S = I_1 + I_2 \tag{1}$$

where $I_1$ designates the current in avalanche diode Z1 and $I_2$ designates the current in avalanche diode Z2.

Neglecting the current coming out of terminal 13, the following relation can be written:

$$I_1 R_Z = I_2(R + R_Z). \tag{2}$$

This leads to:

$$I_S = I_1\left(1 + \frac{R_Z}{R + R_Z}\right) = I_1\left(\frac{R + 2R_Z}{R + R_Z}\right) \tag{3}$$

$$I_S = I_2\left(1 + \frac{R + R_Z}{R_Z}\right) = I_2\left(\frac{R + 2R_Z}{R_Z}\right) \tag{4}$$

Thus, the input voltage $V_e$ resulting from an overload can be written as:

$$V_e = V_Z + R_Z I_S \frac{R + R_Z}{R + 2R_Z} \tag{5}$$

and the output voltage then is:

$$V_S = V_Z + R_Z I_S \frac{R_Z}{R + 2R_Z} \tag{6}$$

Equation (6) shows that if value R is much higher than value $R_Z$, output voltage $V_S$ is substantially equal to $V_Z$.

In a specific example where resistance $R_Z$ is, as previously, equal to 0.4 ohm and where R=50 ohms, factor $R_Z/(R+2R_Z)$ is equal to 0.4/50.8, that is, approximately 1/100.

Figure 1A:
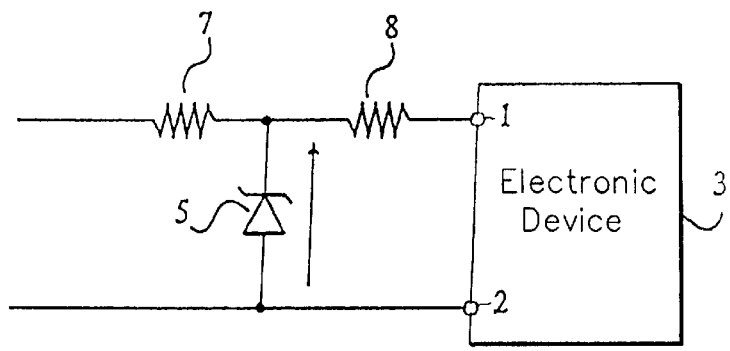
FIG. 1A illustrates a protection structure according to prior art.
Figure 1B:
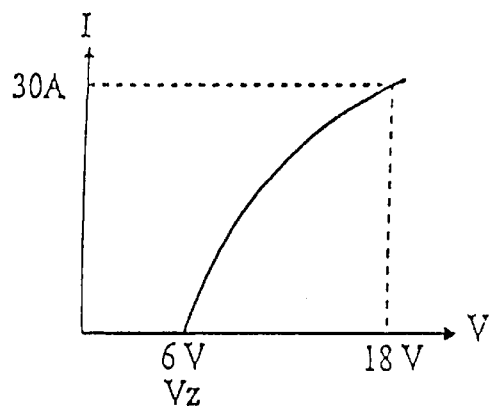
FIG. 1B shows the electric current-voltage characteristic of the protection structure of FIG. 1A.

Thus, by using for diodes Z1 and Z2 the same diode as diode 5 of FIG. 1A, an overvoltage of 0.1 volt only results from the current flow, instead of a 12-volt overvoltage. This shows that, while keeping a very reasonable overvoltage, the surface of the avalanche diodes can be further decreased to further reduce the stray capacitance of the parallel diodes. Diodes four times as small, each having a stray capacitance on the order of 70 pF can, for example, be used.

Those skilled in the art should note that the structure of FIG. 2 can have various alternatives, the two diodes Z1 and Z2 not being necessarily identical, but being adaptable to specific cases.

Figure 3:
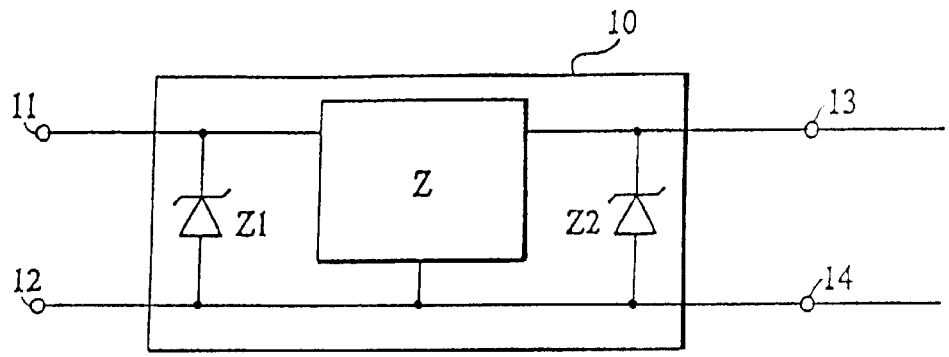
FIG. 3 shows a general shape of the protection structure according to the present invention.

More generally, protection circuit 10 according to the present invention can be such as shown in FIG. 3, resistor R being replaced with a tripole impedance Z. The previously described calculations apply, assuming that value R is the series resistance of tripole Z.

Figure 4A:
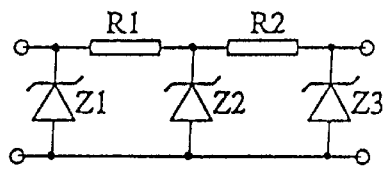
FIGS. 4A, 4B, 4C show various alternatives of the protection structure according to the present invention.
Figure 4B:
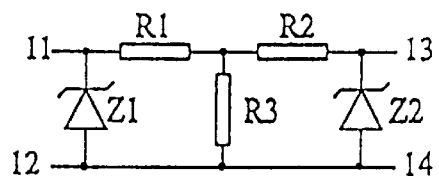
Figure 4C:
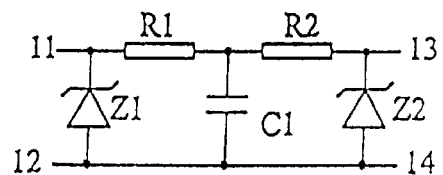

Different specific examples of the general diagram of FIG. 3 are shown as an example in FIGS. 4A to 4C.

In FIG. 4A, an assembly of a resistor R2 and of an avalanche diode Z3 has been used in addition to avalanche diodes Z1 and Z2 and to resistor R (designated as R1 in FIG. 4A). Thus, if the first assembly provides an improvement factor 1 of 100 over the overvoltage introduced by the current overload, complementary assembly R2-Z3 will provide an additional improvement factor of 100, that is, a voltage variation which is on the order of 1/10,000 only. This assembly can be used in cases where the series disposition of two resistors R1 and R2 bears no prejudice to the circuit operation and ensures, especially by the choice of the capacitance of diode Z2, a low-pass filter function.

FIG. 4B shows a structure in which tripole Z includes two resistors R1 and R2 in series between terminals 11 and 13 and one resistor R3 between the connection node of resistors R1 and R2 and terminals 12, 14. An advantage of this structure is to insert an additional bridge for dividing the overvoltage.

In the case of FIG. 4C, impedance Z is a tripole including two resistors R1 and R2 in series between terminals 11 and 13 and a capacitor C1 between the connection node of resistors R1 and R2 and terminals 12, 14.

As will be noted by those skilled in the art, the assembly forms a low-pass filter and for example eliminates the carrier wave in a mobile phone. This filter has cut-off frequencies $f_1 = 1/RC_1\omega$ and $f_Z = 1/RC_Z\omega$, where $C_Z$ designates the capacitance of an avalanche diode, a first attenuation appearing for the first cut-off frequency and a stronger attenuation appearing for the second cut-off frequency.

For R1=R2=R=250Ω, $C_1$=25 pF, and $C_Z$=70 pF, one obtains $f_Z$=45 MHZ and $f_1$=64 MHZ.

For R1=R2=R=50Ω, $C_1$=50 pF, and $C_Z$=70 pF, one obtains f=9 MHZ and $f_1$=25 MHZ.

Thus, the present invention combines, in a simple manner, a protection structure and a filtering structure.

Figure 5:
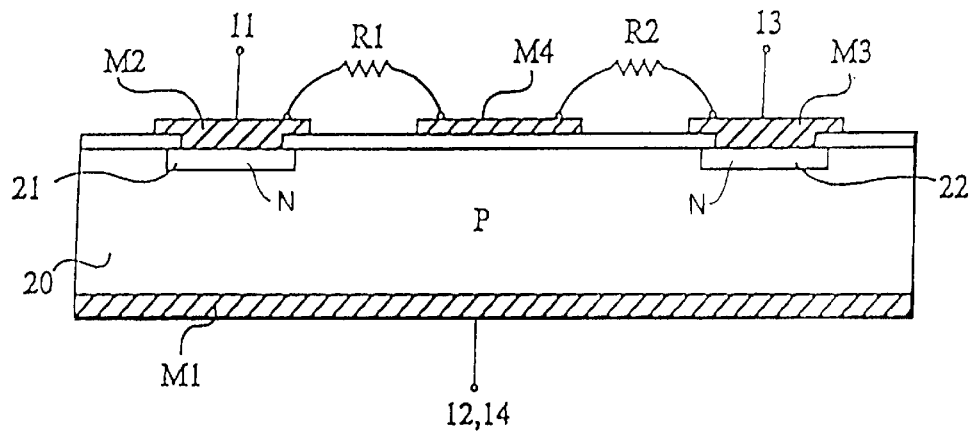
FIG. 5 shows a first implementation in the form of a monolithic structure of the protection circuit of FIG. 4C.

FIG. 5 shows a monolithic implementation of the structure of FIG. 4C according to one embodiment of the present invention. In the example shown, the structure is formed in a P-type substrate 20 in which are formed two N-type regions 21 and 22 forming Zener junctions with the substrate. The lower surface of the component is coated with a metallization M1 corresponding to terminals 12 and 14 of FIG. 4C. Metallizations M2 and M3 formed on regions 21 and 22 correspond to terminals 11 and 13. A capacitor can be implemented between a metallization M4 and substrate 1 and corresponds to capacitor C1 of FIG. 4C. Resistors R1 and R2 can be formed in any known manner, for example, by providing thin conductors forming a portion of the metallization of which are formed contacts M2, M3, and M4. Resistors may also be provided in a polysilicon layer, or diffused resistors formed in wells themselves formed in substrate 20 may further be provided.

As previously indicated, the total surface of junctions 21 and 22 can be very small.

Of course, the structure of FIG. 5 and the circuits illustrated as an example in FIGS. 4A to 4C are likely to have various alterations, modifications, and improvements which will readily occur to those skilled in the art. Further, although the present invention has been described with a one-way (unidirectional) protection component, it of course also applies to bidirectional protection components.

Figure 6A:
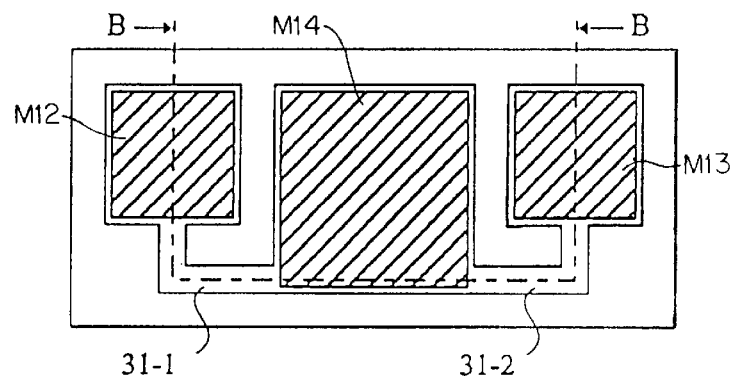
FIGS. 6A and 6B show a second implementation in the form of a monolithic structure of the protection circuit of FIG. 4C.
Figure 6B:
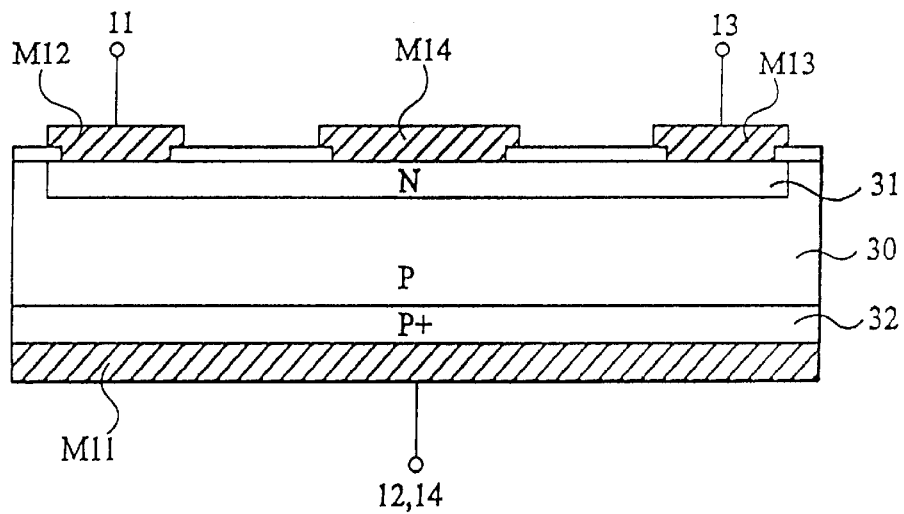

FIGS. 6A and 6B illustrate a second exemplary implementation of of the circuit of FIG. 4C with FIG. 6B being a sectional view of the circuit of FIG. 6A taken along line B—B. The component is made of a P-type substrate 30 that includes on its front or upper surface a N-type region 31. On the rear or lower surface is formed a metallization M11, preferentially with interposition of a more heavily doped P-type region 32. On the front surface are formed respective metallizations M12, M13, M14 in contact with areas of the region 31. Specifically, metallization M12 is formed over an area substantially corresponding to the Zener diode Z1, and metallization M13 is formed over an area substantially corresponding to the capacitor C1.

As better shown in FIG. 6A, the diffused region 31 preferentially includes portions 31-1 and 31-2 that are not covered with a metallization and that extend between the area covered by metallization M14 and, respectively, the area covered by metallization M12 and the area covered by metallization M13. The portions 31-1 and 31-2 respectively correspond to resistors R1 and R2.

Although it has been indicated above that each component is formed under each metallization, it will be clear for those skilled in the art that, in fact, capacitor C1 is distributed and extends further than the area immediately under the metallization M14, under the extensions corresponding to the portions 31-1 and 31-2. It will also be noted that one may consider the area disposed under the metallization M14 as a Zener diode or as a capacitor but that, in the desired operation, this area behaves like a capacitor that has the property of being "self-protected" against electrostatic discharges.

In one exemplary implementation, the P-type substrate 30 has a doping level of about $10^{18}$ atoms/cm$^3$ (resistivity of about 10 mΩ/cm). In this exemplary implementation, N-type region 31 has a doping level of about $10^{20}$ atoms/cm$^3$, which corresponds to a resistance of about 10 Ω/square.

An advantage of the structure of FIGS. 6A–6B is that it is simpler to manufacture than the structure of FIG. 5. Indeed, it is not necessary to provide an oxide layer having a well determined thickness to form the dielectric of a capacitor having a desired capacitance. Also no special steps have to be provided for implementing the resistors R1 and R2.

Another advantage of the structure of FIGS. 6A–6B is that the value of the capacitor is simply adjusted by the mask delimiting the surface area of region 31 under metallization M14.

Another advantage of the structure of FIGS. 6A–6B is that its surface area can be smaller for a desired capacitance value than the structure of FIG. 5. This is due to the fact that a junction capacitance has a value of about 1500 pF/mm$^2$ while a dielectric capacitance, for an oxide thickness of 100 nm, will have a capacitance of only about 500 pF/mm$^2$. In the current power technologies, it is difficult to go under 100 nm for the dielectric thickness.

Of course, this second embodiment is also capable of various modifications that will appear to those skilled in the art. For example, one could provide other implementations of the resistors than that described with respect to FIGS. 6A and 6B. For example, the resistors may be formed of thin metallizations or polysilicon on an insulating material. In this case, the areas of region 31 formed under each metallization would be separated. Additionally, it will be noted that is possible with a single diffused structure to obtain resistances of adjustable value by covering with a metallization at least a part of the portions 31-1 and 31-2.

Such alterations, modifications, and improvements are intended to be within the spirit and the scope of the present invention. Accordingly, the foregoing description is by way of example only and is not intended to be limiting. The present invention is limited only as defined in the following claims and the equivalents thereto.

What is claimed is:

1. A protection circuit for protection against electric surges, connected between two input terminals and two output terminals, the two output terminals being adapted for connection to inputs of a circuit to be protected, wherein:

a first input terminal of the two input terminals is connected to a first output terminal of the two output terminals via a tripole impedance;

a second input terminal of the two input terminals is connected to a second output terminal of the two output terminals;

the first input terminal is interconnected to the second input terminal across a first avalanche diode;

the first output terminal is interconnected to the second output terminal across a second avalanche diode of a same polarity as the first avalanche diode;

the tripole impedance includes two series connected resistors and a capacitor, a first terminal of the capacitor being connected to the two series connected resistors and a second terminal of the capacitor being connected to the second input terminal and the second output terminal, elements of the tripole impedance forming, with the first and second avalanche diodes, a filtering structure; and wherein the protection circuit is implemented monolithically in a substrate of a first conductivity type, the substrate having a front surface and a rear surface, the structure including a region of a second and opposite conductivity type formed on the front surface of the substrate, said region having three main areas, each of the three main areas being covered with a respective first metallization, two of the first metallizations being respectively connected to one of the first input terminal and the first output terminal, the structure further including a second metallization covering the rear surface of the substrate.

2. The protection circuit of claim 1, wherein one of the three main areas is connected to each of the other two main areas by a portion of said region of the second conductivity type having a smaller surface area than portions of said region of the second conductivity type that are below the first metallizations covering the other two main areas.

3. The protection circuit of claim 1, wherein the two main areas arranged under the two first metallizations have a same surface area.

4. The protection circuit of claim 1, wherein the substrate of the first conductivity type is a P-type substrate having a doping level of approximately $10^{18}$ atoms/cm$^3$ and said region of the second and opposite conductivity type is a N-type region having a doping level of about $10^{20}$ atoms/cm$^3$.

* * * * *

UNITED STATES PATENT AND TRADEMARK OFFICE
CERTIFICATE OF CORRECTION

PATENT NO. : 6,304,126 B1
DATED : October 16, 2001
INVENTOR(S) : Denis Berthiot

It is certified that error appears in the above-identified patent and that said Letters Patent is hereby corrected as shown below:

Column 5,
Line 11, should read -- mentation of the circuit of FIG. 4C with FIG. 6B being a --.

Signed and Sealed this

Twelfth Day of March, 2002

Attest:

Attesting Officer

JAMES E. ROGAN
Director of the United States Patent and Trademark Office